(12) United States Patent
Yu et al.

(10) Patent No.: US 10,714,200 B2
(45) Date of Patent: Jul. 14, 2020

(54) METHOD FOR PROGRAMMING ELECTRICALLY PROGRAMMABLE FUSE

(71) Applicant: Wuhan Xinxin Semiconductor Manufacturing Co., Ltd., Wuhan, Hubei (CN)

(72) Inventors: Kuilong Yu, Hubei (CN); Kun Han, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 0 days.

(21) Appl. No.: 16/200,146

(22) Filed: Nov. 26, 2018

(65) Prior Publication Data

US 2019/0362801 A1 Nov. 28, 2019

(30) Foreign Application Priority Data

May 22, 2018 (CN) .......................... 2018 1 0497511

(51) Int. Cl.
*G11C 17/18* (2006.01)
*G11C 17/16* (2006.01)
*H01L 23/525* (2006.01)

(52) U.S. Cl.
CPC .............. *G11C 17/16* (2013.01); *G11C 17/18* (2013.01); *H01L 23/5256* (2013.01)

(58) Field of Classification Search
CPC ...... G11C 17/16; G11C 17/18; H01L 23/5256
USPC .......................................................... 365/96
See application file for complete search history.

(56) References Cited

U.S. PATENT DOCUMENTS

| 6,242,790 B1* | 6/2001 | Tsui ....................... G11C 17/16 257/529 |
| 6,750,530 B1* | 6/2004 | Klaasen .............. H01L 23/5252 257/530 |
| 6,853,049 B2* | 2/2005 | Herner ................ H01L 23/5252 257/173 |
| 7,851,885 B2* | 12/2010 | Kim .................... H01L 23/5256 257/208 |
| 2002/0018355 A1* | 2/2002 | Johnson .............. G11C 11/5692 365/103 |

(Continued)

*Primary Examiner* — Viet Q Nguyen
(74) *Attorney, Agent, or Firm* — Muncy, Geissler, Olds & Lowe, P.C.

(57) ABSTRACT

A method for programming an electrically programmable fuse is disclosed. As conductive medium of the electrically programmable fuse exhibits different physical changes under different conditions, the conductive medium is changed from an initial physical state to a first physical state by using a first programming condition to program the electrically programmable fuse from a low resistance state to a medium resistance state, and the conductive medium is changed from the initial physical state or the first physical state to a second physical state by using a second programming condition to program the electrically programmable fuse from the low resistance state or the medium resistance state to a high resistance state. Transitions of three information storage states are achieved through two different programming conditions, so that the information storage density and chip area utilization rate of an electrically programmable fuse device can be significantly improved, and chip size reduction is facilitated.

9 Claims, 2 Drawing Sheets

(56) References Cited

U.S. PATENT DOCUMENTS

| | | | |
|---|---|---|---|
| 2003/0031074 A1* | 2/2003 | Tran | G11C 17/16 365/225.7 |
| 2005/0052892 A1* | 3/2005 | Low | H01L 23/5256 365/94 |
| 2006/0097240 A1* | 5/2006 | Lowrey | G11C 13/0004 257/5 |
| 2006/0102982 A1* | 5/2006 | Park | H01L 23/5252 257/528 |
| 2006/0152990 A1* | 7/2006 | Huang | G11C 11/5692 365/225.7 |
| 2008/0157125 A1* | 7/2008 | Kim | H01L 23/5252 257/209 |
| 2008/0217734 A1* | 9/2008 | Lin | G11C 11/5692 257/529 |
| 2009/0135640 A1* | 5/2009 | Kim | G11C 17/16 365/96 |
| 2012/0127779 A1* | 5/2012 | Scheuerlein | G11C 5/02 365/148 |
| 2012/0176831 A1* | 7/2012 | Xiao | G11C 13/0007 365/148 |
| 2012/0314473 A1* | 12/2012 | Chung | G11C 11/5678 365/96 |
| 2012/0320657 A1* | 12/2012 | Chung | G11C 11/56 365/96 |
| 2016/0078933 A1* | 3/2016 | Peng | G11C 13/0002 365/148 |
| 2018/0005703 A1* | 1/2018 | Chung | H01L 45/06 |

\* cited by examiner

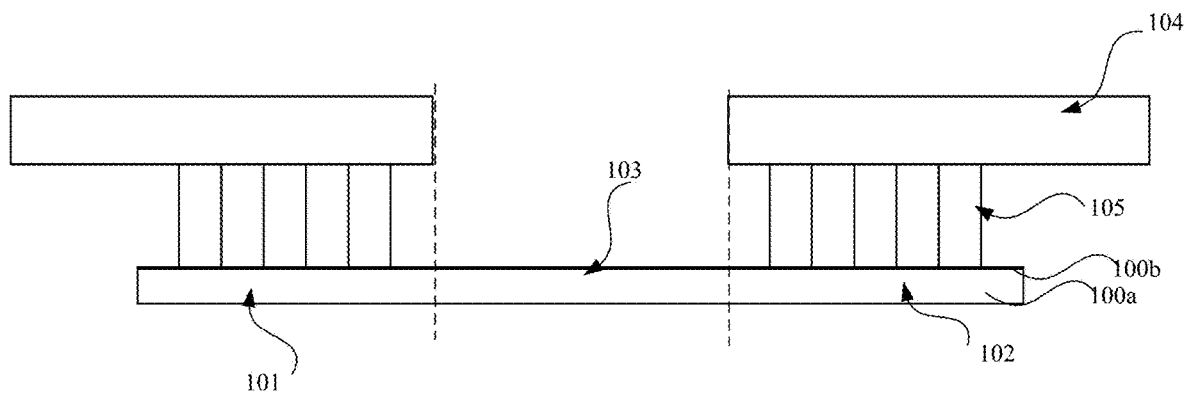

FIG. 1

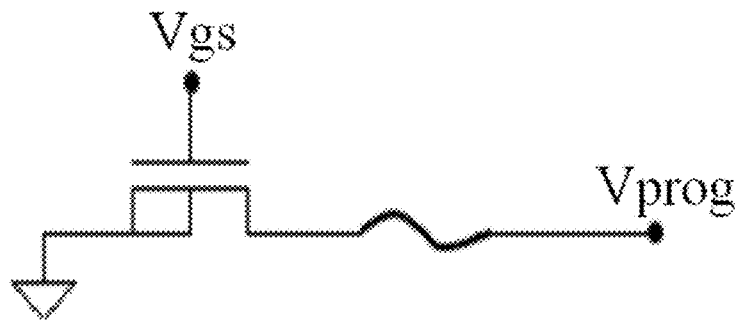

FIG. 2

| Program the electrically programmable fuse by using a first programming condition to program the electrically programmable fuse from a low resistance state to a medium resistance state | S1 |

| Program the electrically programmable fuse by using a second programming condition that is different from the first programming condition to program the electrically programmable fuse from the low resistance state or the medium resistance state to a high resistance state | S2 |

FIG. 3

METHOD FOR PROGRAMMING ELECTRICALLY PROGRAMMABLE FUSE

CROSS-REFERENCE TO RELATED APPLICATION

This application claims the priority of Chinese patent application number 201810497511.7, filed on May 22, 2018, the entire contents of which are incorporated herein by reference.

TECHNICAL FIELD

The present invention relates to the technical field of integrated circuit manufacturing, and in particular, to a method for programming an electrically programmable fuse.

BACKGROUND

An Electrically Programmable Fuse (hereinafter referred to as EFUSE) is a one-time programming device in an integrated circuit that is compatible with CMOS logic devices, and can be applied to information storage, circuit repair, or the like. A typical EFUSE structure includes an anode and a cathode, as well as a fuse link located between and connected to the anode and the cathode. The information storage and circuit repair functions of the EFUSE are implemented by changing the resistance value state of the fuse link. In an EFUSE programming process, electro-migration or thermal fusing occurs in the fuse link, so that the resistance of the fuse link is changed from a low resistance state to a high resistance state. The low resistance state and the high resistance state form two digital states "0" and "1".

At present, EFUSE programming uses only a single programming condition for one-time programming Information bits formed based on the EFUSE have only two states, i.e., the low resistance state and the high resistance state. Compared with a Multi-level cell (MLC) information storage device, the information storage density is low and the occupied area of a chip is large.

SUMMARY OF THE INVENTION

The objective of the present invention is to provide a method for programming an electrically programmable fuse. The method can significantly improve the information storage density and chip area utilization rate, and facilitates chip size reduction.

In order to achieve the above objective, the present invention provides a method for programming an electrically programmable fuse, wherein the electrically programmable fuse has a conductive medium, the conductive medium having an initial physical state, a first physical state, and a second physical state; the programming method includes the following steps:

programming the electrically programmable fuse by using a first programming condition to change the conductive medium from the initial physical state to the first physical state, so as to program the electrically programmable fuse from a low resistance state to a medium resistance state; and programming the electrically programmable fuse by using a second programming condition that is different from the first programming condition to change the conductive medium from the initial physical state or the first physical state to the second physical state, so as to program the electrically programmable fuse from the low resistance state or the medium resistance state to a high resistance state.

Optionally, the electrically programmable fuse is a poly-silicon fuse; the conductive medium is a metal silicide; and the electrically programmable fuse further has a poly-silicon substrate carrying the metal silicide.

Optionally, the initial physical state of the conductive medium is a state of the conductive medium being deposited on the poly-silicon substrate; the first physical state of the conductive medium is a state of the conductive medium being diffused to a molten poly-silicon substrate; and the second physical state of the conductive medium is a state of the conductive medium having electro-migration occurred therein.

Optionally, the metal silicide includes at least one metal selected from the group consisting of nickel, tungsten, cobalt, manganese, titanium and tantalum.

Optionally, the first programming condition and the second programming condition are different in programming time, and the first programming condition has a programming time shorter than a programming time of the second programming condition.

Optionally, both the first programming condition and the second programming condition include a programming pulse, and a time width of the programming pulse of the first programming condition is smaller than a time width of the programming pulse of the second programming condition.

Optionally, the time width of the programming pulse of the second programming condition is more than twice the time width of the first programming condition.

Optionally, the resistance in the low resistance state is on the order of 100 ohms, the resistance in the medium resistance state is on the order of 1e4 ohms, and the resistance in the high resistance state is on the order of 1e6 ohms.

Optionally, the electrically programmable fuse includes an anode, a cathode, and a fuse link for connecting the anode and the cathode; during programming of the electrically programmable fuse, the cathode of the electrically programmable fuse is electrically connected to one end of a switch path of a MOS transistor, and a constant voltage signal is input to the anode of the electrically programmable fuse; the other end of the switch path of the MOS transistor is grounded; the programming pulse is input to a gate of the MOS transistor.

Optionally, the electrically programmable fuse further includes contact plugs electrically connected to the anode and the cathode respectively, and metal interconnect wires electrically connected to the corresponding contact plugs.

Compared with the prior art, in the method for programming an electrically programmable fuse of the present invention, based on the characteristic that the conductive medium of the electrically programmable fuse exhibits different physical changes under different power conditions, the conductive medium is changed from the initial physical state to the first physical state, such as molten diffusion, by using the first programming condition so as to program the electrically programmable fuse from the low resistance state to the medium resistance state, and the conductive medium is changed from the initial physical state or the first physical state to the second physical state by using the second programming condition so as to program the electrically programmable fuse from the low resistance state or the medium resistance state to the high resistance state. That is, transitions of three information storage states are achieved through two different programming conditions, so that the information storage density and chip area utilization rate of an electrically programmable fuse device can be significantly improved, and chip size reduction is facilitated.

BRIEF DESCRIPTION OF DRAWINGS

FIG. 1 is a schematic structural diagram of a cross section of an electrically programmable fuse according to a specific embodiment of the present invention;

FIG. 2 is a schematic diagram of circuit connection during programming of an electrically programmable fuse according to a specific embodiment of the present invention;

FIG. 3 is a flowchart of a method for programming an electrically programmable fuse according to a specific embodiment of the present invention;

DETAILED DESCRIPTION OF EXEMPLARY EMBODIMENTS

Figure 4:
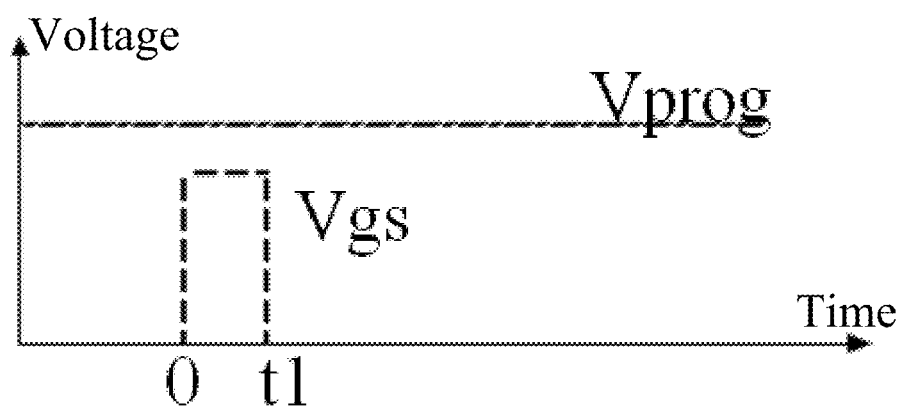
FIG. 4 is a diagram illustrating the relation between programming time and a programming voltage in a first programming condition according to a specific embodiment of the present invention.

A poly-silicon EFUSE is a one-time programming device that is widely applied at present. Through research on a programming mechanism of the poly-silicon EFUSE, the applicant has found that a medium state exists in a poly-silicon EFUSE programming process, and programming may further be performed on the basis of the medium state, so that information bits manufactured using the poly-silicon EFUSE have three states, i.e., a low resistance state, a medium resistance state, and a high resistance state. Designing an EFUSE storage device on this basis can significantly improve the information storage density and chip area utilization rate of the EFUSE storage device, and is of great significance for chip size reduction.

On this basis, the method for programming an electrically programmable fuse of the present invention can implement the design of a multi-level EFUSE device. Based on the characteristic that a conductive medium of the electrically programmable fuse exhibits different physical changes under different power conditions. The electrically programmable fuse is programmed by using different programming conditions, so that the physical states of the conductive medium of the electrically programmable fuse are changed correspondingly. The electrically programmable fuse is programmed from the low resistance state to the medium resistance state or from the low resistance state or the medium resistance state to the high resistance state, thereby implementing transitions of three information storage states. Therefore, the information storage density and chip area utilization rate of an electrically programmable fuse storage device can be significantly improved, and chip size reduction is facilitated.

In order to make the objectives and features of the present invention more apparent, the technical solutions of the present invention are described in detail below by taking a poly-silicon EFUSE as an example in conjunction with the accompanying drawings. However, the present invention can be implemented in different forms, and shall not be limited to the described embodiments only.

Referring to FIG. 1, a poly-silicon EFUSE is a one-time programming device that is widely applied at present, which adopts a double-film structure, i.e., comprised of a poly-silicon substrate 100a and a metal silicide (i.e., a conductive medium) 100b. That is, the poly-silicon substrate carries the metal silicide. The structure of the poly-silicon EFUSE may be functionally divided into an anode 101, a cathode 102, and a fuse link 103 between the anode 101 and the cathode 102. The anode 101 and the cathode 102 are respectively connected to corresponding metal interconnect wires 104 by means of conductive plugs 105 above the anode 101 and the cathode 102. The poly-silicon EFUSE may be manufactured by using a 65 nm CMOS integrated circuit manufacturing process. The metal silicide may include at least one metal selected from the group consisting of nickel (Ni), tungsten (W), cobalt (Co), manganese (Mn), titanium (Ti), and tantalum (Ta), for example, the metal silicide is Ni-Silicide. The metal silicide has different physical states under different conditions. In the embodiment, a state in which the metal silicide 100b is formed by depositing on the poly-silicon substrate 100a is defined as the initial physical state of the metal silicide. A state in which the poly-silicon substrate 100a is molten and the metal silicide 100b is diffused into the poly-silicon substrate 100a is defined as the first physical state of the metal silicide 100b. A state in which the metal silicide 100b is migrated from the cathode 102 to the anode 101 under the action of electro-migration is defined as the second physical state of the metal silicide 100b.

Referring to FIG. 2, before programming the poly-silicon EFUSE shown in FIG. 1, the cathode 102 of the poly-silicon EFUSE is first connected to one end (i.e., the source or drain) of a switch path (i.e., source-drain conduction path) of an MOS transistor by means of a metal interconnect wire 104, and the other end (i.e., the source or drain) of the switch path of the MOS transistor is grounded.

Referring to FIG. 3, the embodiment provides a method for programming a poly-silicon EFUSE, including the following steps.

Figure 5:
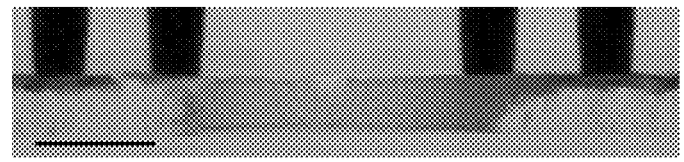
FIG. 5 is a sectional view of a transmission electron microscope when an electrically programmable fuse is programmed to a medium resistant state according to a specific embodiment of the present invention.

S1: Program the poly-silicon EFUSE by using a first programming condition to change the conductive medium from the initial physical state to the first physical state, so as to program the electrically programmable fuse from a low resistance state to a medium resistance state. Specifically, referring to FIGS. 1, 2, and 4, a voltage signal Vprog (a constant voltage signal) is input to the anode 101 of the poly-silicon EFUSE; a programming pulse (i.e., a pulse voltage signal) is input to a gate of the MOS transistor, and the pulse voltage thereof is Vgs (the absolute value may be smaller than that of Vprog); and a time width of the programming pulse is t1. That is, the first programming condition includes the constant voltage signal Vprog, the programming pulse (the pulse voltage value is Vgs), and the programming time t1 (i.e., the time width of the programming phase). In this programming process, as shown in FIG. 5, the poly-silicon substrate 100a of the poly-silicon EFUSE is molten as the first programming condition is applied, and the metal in the metal silicide 100b is diffused into the poly-silicon substrate 100a. A metal concentration in the metal silicide 100b is reduced, so that the resistance of a fuse link 103 of the poly-silicon EFUSE is increased to reach the medium resistance state. The resistance value of the poly-silicon EFUSE in the low resistance state is on the order of 100 ohms, and the resistance value in the medium resistance state is, for example, on the order of 1e4 ohms.

Figure 6:
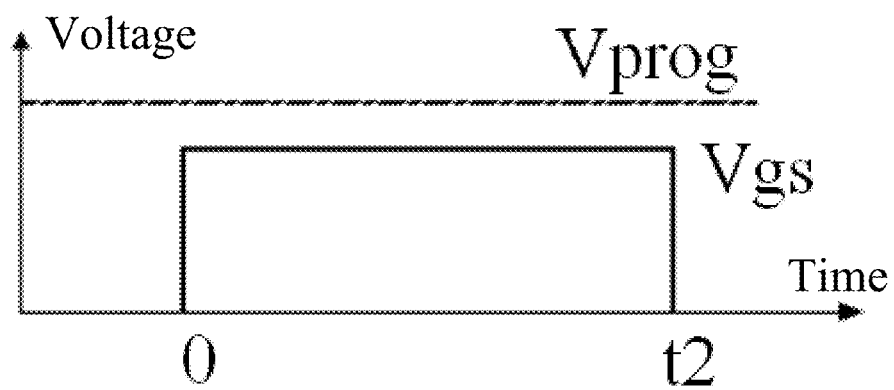
FIG. 6 is a diagram illustrating the relation between programming time and a programming voltage in a second programming condition according to a specific embodiment of the present invention.
Figure 7:
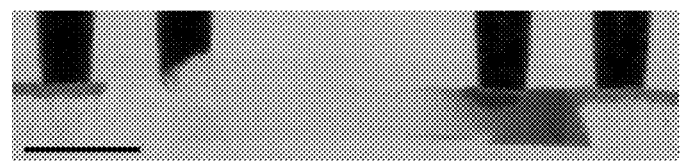
FIG. 7 is a sectional view of a transmission electron microscope when an electrically programmable fuse is programmed to a high resistant state according to a specific embodiment of the present invention.

S2: Program the electrically programmable fuse by using a second programming condition that is different from the first programming condition to change the conductive medium from the initial physical state or the first physical state to the second physical state, so as to program the electrically programmable fuse from the low resistance state or the medium resistance state to a high resistance state. Specifically, referring to FIGS. 1, 2, and 6, a voltage signal Vprog (a constant voltage signal) is input to the anode 101 of the poly-silicon EFUSE; the other programming pulse (i.e., the other pulse voltage signal) is input to the gate of the MOS transistor, and the pulse voltage thereof is Vgs (the absolute value may be smaller than that of Vprog); and a time width of the programming pulse is t2, and t2 is greater than t1, for example, t2 is more than twice t1. That is, the second programming condition includes the constant voltage signal Vprog, the programming pulse (the pulse voltage value is Vgs), and the programming time t2 (i.e., the time width of the programming phase). In this programming process, the distribution of the metal in the metal silicide 100b of the poly-silicon EFUSE at the fuse link 103 is interrupted due to electro-migration as the second programming is applied. As shown in FIG. 7, poly-silicon resistance causes the resistance value of the poly-silicon EFUSE to increase to reach the high resistance state, and the resistance is on the order of 1e6 ohms.

In view of the above, the low resistance state, the middle resistance state, and the high resistance state of the poly-silicon EFUSE respectively correspond to the three different physical states of the metal silicide 100b in the poly-silicon EFUSE, so that the poly-silicon EFUSE has a wide programming window. Moreover, the poly-silicon EFUSE having the low resistance state, the middle resistance state, and the high resistance state is higher than a common EFUSE device in information storage density by 50%, can significantly improve the chip area utilization rate, and is of great significance for chip size reduction.

It should be notated that: firstly, the resistance value of the poly-silicon EFUSE changes with the size design and process of the fuse link 103, and therefore, the resistance value of the poly-silicon EFUSE of the present invention is not limited to the above resistance orders; secondly, in the above embodiments, the transitions of three information storage states of the poly-silicon EFUSE are mainly implemented through two programming conditions which are different in programming time, but in practical applications, the programming conditions may be adjusted and optimized, and are not limited to the implementation based on programming time. In addition, the poly-silicon EFUSE is taken as an example in the above embodiments, but the programming method of the present invention is not just limited to the poly-silicon EFUSE, and may also be applied to other types of EFUSEs or devices, as long as theses EFUSEs have a highly conductive medium with similar conductivity to a metal silicide; moreover, the highly conductive medium can have different physical state changes under different conditions (particularly, under different power conditions), i.e., can implement the difference between the information storage states. The physical state changes include molten diffusion and migration of the conductive medium.

In conclusion, in the method for programming an electrically programmable fuse of the present invention, based on the characteristic that the conductive medium of the electrically programmable fuse exhibits different physical changes under different power conditions, the conductive medium is changed from the initial physical state to the first physical state, such as molten diffusion, by using the first programming condition so as to program the electrically programmable fuse from the low resistance state to the medium resistance state, and the conductive medium is changed from the initial physical state or the first physical state to the second physical state by using the second programming condition so as to program the electrically programmable fuse from the low resistance state or the medium resistance state to the high resistance state. That is, transitions of three information storage states are achieved through two different programming conditions, so that the information storage density and chip area utilization rate of an electrically programmable fuse device can be significantly improved, and chip size reduction is facilitated.

It is apparent that persons skilled in the art can make various modifications and variations to the present invention without departing from the spirit and scope of the present invention. Thus, if these modifications and variations of the present invention fall within the scope of the claims of the present invention and technical equivalents thereof, the present invention is also intended to include these modifications and variations.

What is claimed is:

1. A method for programming an electrically programmable fuse, wherein the electrically programmable fuse has a conductive medium, the conductive medium having an initial physical state, a first physical state, and a second physical state, the programming method comprising the following steps:
   programming the electrically programmable fuse by using a first programming condition to change the conductive medium from the initial physical state to the first physical state, so as to program the electrically programmable fuse from a low resistance state to a medium resistance state; and
   programming the electrically programmable fuse by using a second programming condition that is different from the first programming condition to change the conductive medium from the initial physical state or the first physical state to the second physical state, so as to program the electrically programmable fuse from the low resistance state or the medium resistance state to a high resistance state,
   wherein the first programming condition and the second programming condition are different in programming time, and wherein the first programming condition has a programming time shorter than a programming time of the second programming condition.

2. The programming method according to claim 1, wherein the electrically programmable fuse is a poly-silicon fuse; the conductive medium is a metal silicide; and the electrically programmable fuse further has a poly-silicon substrate carrying the metal silicide.

3. The programming method according to claim 2, wherein the initial physical state of the conductive medium is a state of the conductive medium being deposited on the poly-silicon substrate; the first physical state of the conductive medium is a state of the conductive medium being diffused to a molten poly-silicon substrate; and the second physical state of the conductive medium is a state of the conductive medium having electro-migration occurred therein.

4. The programming method according to claim 2, wherein the metal silicide comprises at least one metal selected from the group consisting of nickel, tungsten, cobalt, manganese, titanium and tantalum.

5. The programming method according to claim 1, wherein the first programming condition and the second programming condition each comprise a programming pulse, and wherein a time width of the programming pulse of the first programming condition is smaller than a time width of the programming pulse of the second programming condition.

6. The programming method according to claim 5, wherein the time width of the programming pulse of the second programming condition is more than twice the time width of the first programming condition.

7. The programming method according to claim 1, wherein a resistance in the low resistance state is on an order of 100 ohms, a resistance in the medium resistance state is on an order of 1e4 ohms, and a resistance in the high resistance state is on an order of 1e6 ohms.

8. The programming method according to claim 1, wherein the electrically programmable fuse comprises an anode, a cathode, and a fuse link for connecting the anode and the cathode; during programming of the electrically programmable fuse, the cathode of the electrically programmable fuse is electrically connected to one end of a switch path of a MOS transistor, and a constant voltage signal is input to the anode of the electrically programmable fuse; the other end of the switch path of the MOS transistor is grounded; the programming pulse is input to a gate of the MOS transistor.

9. The programming method according to claim 8, wherein the electrically programmable fuse further comprises contact plugs electrically connected to the anode and the cathode respectively, and metal interconnect wires electrically connected to the corresponding contact plugs.

\* \* \* \* \*